US011852688B2

(12) United States Patent
Cha et al.

(10) Patent No.: US 11,852,688 B2
(45) Date of Patent: Dec. 26, 2023

(54) APPARATUS AND METHOD FOR DETERMINING DEGRADATION DEGREE OF BATTERY AND BATTERY PACK COMPRISING THE APPARATUS

(71) Applicant: LG Energy Solution, Ltd., Seoul (KR)

(72) Inventors: A-Ming Cha, Daejeon (KR); Yoon-Jung Bae, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 195 days.

(21) Appl. No.: 17/417,890

(22) PCT Filed: May 7, 2020

(86) PCT No.: PCT/KR2020/006047
§ 371 (c)(1),
(2) Date: Jun. 24, 2021

(87) PCT Pub. No.: WO2020/231086
PCT Pub. Date: Nov. 19, 2020

(65) Prior Publication Data
US 2022/0075000 A1 Mar. 10, 2022

(30) Foreign Application Priority Data
May 14, 2019 (KR) .................. 10-2019-0056467

(51) Int. Cl.
*G01R 31/392* (2019.01)
*G01R 31/3842* (2019.01)
*H02J 7/00* (2006.01)

(52) U.S. Cl.
CPC ....... *G01R 31/392* (2019.01); *G01R 31/3842* (2019.01); *H02J 7/005* (2020.01)

(58) Field of Classification Search
None
See application file for complete search history.

(56) References Cited

U.S. PATENT DOCUMENTS

2011/0012604 A1 1/2011 Tsujiko et al.
2012/0169288 A1 7/2012 Ueki et al.
(Continued)

FOREIGN PATENT DOCUMENTS

JP 2010257984 A 11/2010
JP 2013068458 A 4/2013
(Continued)

OTHER PUBLICATIONS

International Search Report for Application No. PCT/KR2020/006047, dated Aug. 24, 2020, 3 pages.
(Continued)

*Primary Examiner* — Jas A Sanghera
(74) *Attorney, Agent, or Firm* — BRYAN CAVE LEIGHTON PAISNER LLP

(57) ABSTRACT

Provided are an apparatus, method and battery pack for determining a degradation degree of a battery. The apparatus generates first sensing information indicating a voltage and a current of the battery while the battery is charged with a first constant current. The apparatus generates second sensing information indicating a voltage and a current of the battery for a second period during which the battery is discharged with a second constant current. The apparatus determines a first differential capacity curve based on the first sensing information and a second differential capacity curve based on the second sensing information. The apparatus is configured to determine the degradation degree of the battery based on a voltage value of a first charge feature point of the first differential capacity curve and a voltage value of a first discharge feature point of the second differential capacity curve.

11 Claims, 7 Drawing Sheets

(56) References Cited

U.S. PATENT DOCUMENTS

| | | | |
|---|---|---|---|
| 2012/0226455 A1 | 9/2012 | Kumashiro et al. | |
| 2013/0119940 A1 | 5/2013 | Iriyama et al. | |
| 2013/0335009 A1 | 12/2013 | Katsumata et al. | |
| 2016/0061908 A1 | 3/2016 | Torai et al. | |
| 2016/0195589 A1 | 7/2016 | Hanyu et al. | |
| 2019/0383878 A1* | 12/2019 | Coenen | H02J 7/005 |
| 2022/0158468 A1* | 5/2022 | Cha | G01R 31/3648 |

FOREIGN PATENT DOCUMENTS

| | | |
|---|---|---|
| JP | 2014007025 A | 1/2014 |
| JP | 2014092471 A | 5/2014 |
| JP | 2014139897 A | 7/2014 |
| JP | 5682955 B2 | 3/2015 |
| JP | 2015060761 A | 3/2015 |
| JP | 6123844 B2 | 5/2017 |
| JP | 2017133870 A | 8/2017 |
| JP | 2018205139 A | 12/2018 |
| JP | 2019045351 A | 3/2019 |
| JP | 6500789 B2 | 4/2019 |
| JP | 2019056595 A | 4/2019 |
| KR | 101337153 B1 | 12/2013 |
| KR | 20130142884 A | 12/2013 |
| WO | 2011036760 A1 | 3/2011 |

OTHER PUBLICATIONS

Extended European Search Report for Application No. 20806580.5 dated Feb. 28, 2022. 8 pgs.

* cited by examiner

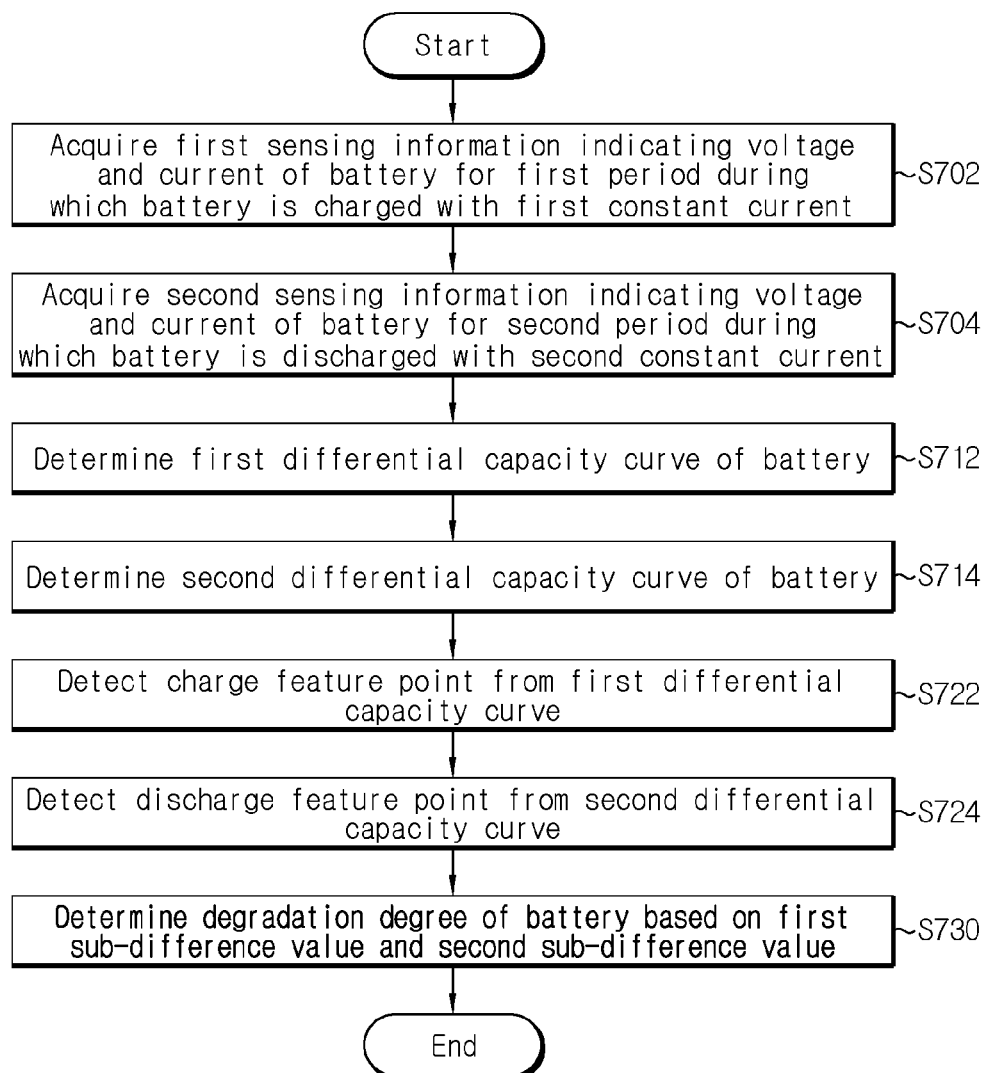

APPARATUS AND METHOD FOR DETERMINING DEGRADATION DEGREE OF BATTERY AND BATTERY PACK COMPRISING THE APPARATUS

CROSS-REFERENCE TO RELATED PATENT APPLICATIONS

The present application is a national phase entry under 35 U.S.C. § 371 of International Application No. PCT/KR2020/006047 filed May 7, 2020, published in Korean, which claims priority from Korean Patent Application No. 10-2019-0056467 filed May 14, 2019, all of which are incorporated herein by reference.

TECHNICAL FIELD

The present disclosure relates to technology for determining a degradation degree of a battery.

BACKGROUND ART

Recently, there has been a dramatic increase in demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

The degradation degree of a battery is determined from a capacity curve indicating a correlation between voltage and remaining capacity of the battery. However, in the capacity curve, there is a remaining capacity range in which voltage changes are not clearly observed, it is difficult to accurately determine the degradation degree of the battery.

To overcome the disadvantage of the capacity curve, the degradation degree of the battery may be determined from a differential voltage curve of the battery using the differential voltage analysis (DVA). However, the differential voltage curve acquired by performing only one of the charge process and the discharge process of the battery does not sufficiently include information about the hysteresis characteristics of the battery.

SUMMARY

Technical Problem

The present disclosure is designed to solve the above-described problem, and therefore the present disclosure is directed to providing an apparatus, method and battery pack for determining a degradation degree of a battery using both a differential capacity curve acquired from the charge process of the battery and a differential capacity curve acquired from the discharge process of the battery.

These and other objects and advantages of the present disclosure may be understood by the following description and will be apparent from the embodiments of the present disclosure. In addition, it will be easily understood that the objects and advantages of the present disclosure may be realized by the means set forth in the appended claims and a combination thereof.

Technical Solution

An apparatus for determining a degree of degradation of a battery according to an aspect of the present disclosure comprises a sensing unit configured to generate first sensing information indicating a voltage and a current of the battery for a first period during which the battery is charged with a first constant current and second sensing information indicating a voltage and a current of the battery for a second period during which the battery is discharged with a second constant current, and a control unit operably coupled to the sensing unit. The control unit is configured to determine a first differential capacity curve of the battery based on the first sensing information. The control unit is configured to detect a first charge feature point from the first differential capacity curve. The control unit is configured to determine a second differential capacity curve of the battery based on the second sensing information. The control unit is configured to detect a first discharge feature point from the second differential capacity curve. The control unit is configured to determine the degree of degradation of the battery based on a first charge feature value and a first discharge feature value. The first charge feature value is a voltage value of the first charge feature point. The first discharge feature value is a voltage value of the first discharge feature point.

The first differential capacity curve may include one or more ordered first peaks, the second differential capacity curve may include one or more ordered second peaks, a total number of the ordered first peaks may be predetermined, a total number of the ordered second peaks may be predetermined, the first charge feature point may be an $i^{th}$ peak of the one or more ordered first peaks, the first discharge feature point may be an $i^{th}$ peak of the one or more ordered second peaks, and i is a predetermined value.

The control unit may be configured to determine a first main difference value indicating an absolute value of a difference between the first charge feature value and the first discharge feature value. The control unit may be configured to determine the degree of degradation of the battery from a first data table that includes a correlation between the first main difference value and the degree of degradation, using the first main difference value as an index.

The total number of the ordered first peaks may be two or greater, and the total number of the ordered second peaks may be two or greater, and the control unit may be configured to determine a second charge feature point from the first differential capacity curve, wherein the second charge feature point is an $j^{th}$ peak of the ordered first peaks. The control unit may be configured to determine a second discharge feature point from the second differential capacity curve, wherein the second discharge feature point is an $j^{th}$ peak of the ordered second peaks, wherein j is a predetermined value. The control unit may be configured to determine a second main difference value indicating an absolute value of a difference between a second charge feature value and a second discharge feature value. The second charge feature value is a voltage value of the second charge feature point. The second discharge feature value is a voltage value of the second discharge feature point.

The control unit may be configured to determine a first degradation factor using the following Equation:

$$F_{deg} = \sum_{i=1}^{2}(\Delta V_i \times \alpha_i)$$ [Equation]

wherein $\Delta V_i$ is an $i^{th}$ main difference value, $\alpha_i$ is an $i^{th}$ predetermined weight, and $F_{deg}$ is the first degradation factor. The control unit may be configured to determine the degree of degradation of the battery from a second data table that includes a correlation between the first degradation factor and the degree of degradation, using the first degradation factor as an index.

The control unit may be configured to determine a first sub-difference value indicating an absolute value of a difference between the first charge feature value and a first initial charge feature value. The control unit may be configured to determine a second sub-difference value indicating an absolute value of a difference between the first discharge feature value and a first initial discharge feature value. The control unit may be configured to determine the degree of degradation of the battery based on the first sub-difference value and the second sub-difference value.

The control unit may be configured to determine a second degradation factor, wherein the second degradation factor is a sum of (i) a product of the first sub-difference value and a first transform coefficient and (ii) a product of the second sub-difference value and a second transform coefficient. The control unit may be configured to determine the degree of degradation of the battery from a third data table that includes a correlation between the second degradation factor and the degree of degradation, using the second degradation factor as an index.

A battery pack according to another aspect of the present disclosure comprises any of the apparatuses described herein.

A method according to still another aspect of the present disclosure comprises acquiring first sensing information indicating a voltage and a current of the battery for a first period during which the battery is charged with a first constant current, acquiring second sensing information indicating a voltage and a current of the battery for a second period during which the battery is discharged with a second constant current, determining a first differential capacity curve of the battery based on the first sensing information, determining a second differential capacity curve of the battery based on the second sensing information, detecting a first charge feature point from the first differential capacity curve, detecting a first discharge feature point from the second differential capacity curve, and determining the degree of degradation of the battery based on a first charge feature value and a first discharge feature value. The first charge feature value is a voltage value of the first charge feature point. The first discharge feature value is a voltage value of the first discharge feature point.

Determining the degree of degradation of the battery may comprise determining a first main difference value indicating an absolute value of a difference between the first charge feature value and the first discharge feature value, and determining the degree of degradation of the battery may be further based from a first data table that records a correlation between the first main difference value and the degree of degradation, using the first main difference value as an index.

Advantageous Effects

According to at least one of the embodiments of the present disclosure, it is possible to determine a degradation degree of a battery using both a differential capacity curve acquired from the charge process of the battery and a differential capacity curve acquired from the discharge process of the battery. The hysteresis characteristics of the battery has a strong correlation with the degradation degree of the battery, and thus it is possible to determine the degradation degree of the battery more accurately when both the two differential capacity curves are used than when only one differential capacity curve is used.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

FIG. 7 is a flowchart illustrating a method for determining a degradation degree of a battery according to a third embodiment of the present disclosure.

DETAILED DESCRIPTION

Figure 1:
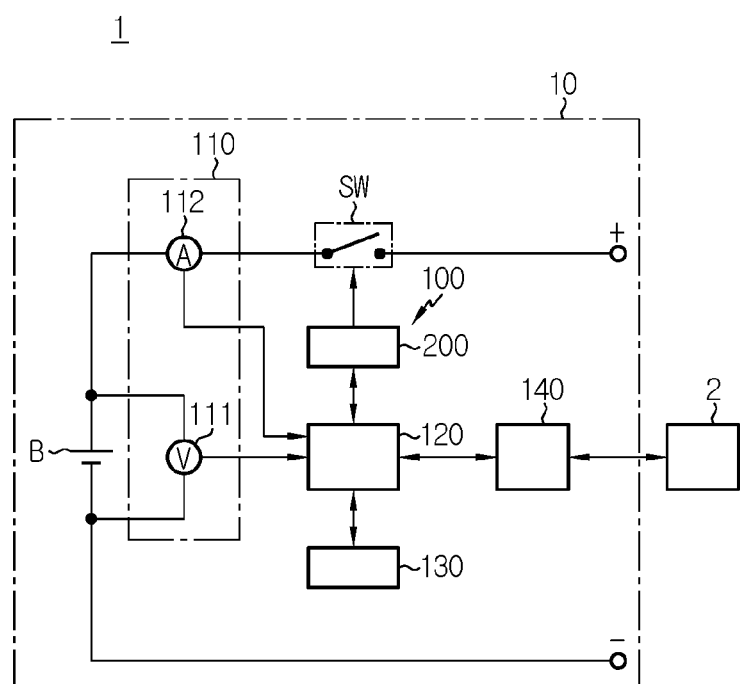
FIG. 1 is a diagram illustrating a configuration of a battery pack according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware or software alone or in combination.

In addition, throughout the specification, it will be further understood that when an element is referred to as being "connected to" another element, it can be directly connected to the other element or intervening elements may be present.

FIG. 1 is a diagram illustrating a configuration of a battery pack according to an embodiment of the present disclosure.

Referring to FIG. 1, the battery pack 10 is provided to be installed in an electrical system 1 (e.g., an electric vehicle), and includes a battery B, a switch SW and an apparatus 100.

Positive and negative terminals of the battery B are electrically connected to the apparatus 100. The battery B includes at least one unit cell. The unit cell may be, for example, a lithium ion battery. The type of the unit cell is not limited to the lithium ion battery, and any other type of battery cell that can be repeatedly recharged may be used as the unit cell.

The switch SW is installed on a path of current for the charge and discharge of the battery B. While the switch SW is turned on, the battery B may be charged and discharged. The switch SW may be a mechanical relay that is turned on or off by the magnetic force of a coil or a semiconductor switch such as a Metal Oxide Semiconductor Field Effect transistor (MOSFET). While the switch SW is turned off, the charge and discharge of the battery B is stopped. The switch SW may be turned on in response to a first switching signal. The switch SW may be turned off in response to a second switching signal.

The apparatus 100 is provided to determine a degradation degree of the battery B. The degradation degree may be a value that increases as the battery B degrades.

The apparatus 100 includes a sensing unit 110, a control unit 120 and a memory unit 130. The apparatus 100 may further include at least one of an interface unit 140 and a switch driver 200.

The sensing unit 110 includes a voltage sensor 111 and a current sensor 112.

The voltage sensor 111 is electrically connected to the positive terminal and the negative terminal of the battery B. The voltage sensor 111 is configured to measure a voltage across the battery B at each unit time (e.g., 0.01 sec) while the battery B is charged or discharged. The current sensor 112 is installed on a charge/discharge path of the battery B. The current sensor 112 is configured to measure the current of the battery B at each unit time while the battery B is charged or discharged.

The sensing unit 110 is configured to output sensing information indicating the voltage and the current of the battery B at each unit time to the control unit 120.

The control unit 120 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The control unit 120 is operably coupled to at least one of the sensing unit 110, the memory unit 130, the interface unit 140 and the switch driver 200.

When at least one of predetermined event(s) occurs, the control unit 120 may command the switch driver 200 to turn on the switch SW. In other situations, the control unit 120 may command the switch driver 200 to turn off the switch SW.

The control unit 120 is configured to store data indicating a voltage history, a current history and a remaining capacity history of the battery B in the memory unit 130 based on the sensing information from the sensing unit 110. The history of a parameter refers to a time series change of the corresponding parameter over a certain or specific period. The voltage history, the current history and the remaining capacity history of the battery B may be those for the same or different periods. The remaining capacity of the battery B indicates an amount of charge stored in the battery B.

The control unit 120 determines a first capacity curve and a second capacity curve of the battery B.

The first capacity curve indicates a correlation between the voltage history and the remaining capacity history, acquired for a period (hereinafter referred to as a "first period") during which the battery B is charged with a constant current of a first current rate (e.g., 0.02 C) from a first state of charge (SOC) (e.g., 5%) or less to a second SOC (e.g., 95%) or more. The first capacity curve is based on first sensing information indicating the voltage and the current of battery B at each unit time, output by the sensing unit 110 for the first period. The control unit 120 may control the switch driver 200 to allow the charge current of the first current rate to flow through the battery B for the first period.

The second capacity curve indicates a correlation between the voltage history and the remaining capacity history, acquired for a period (hereinafter referred to as a "second period") during which the battery B is discharged with a constant current of a second current rate from the second SOC or more to the first SOC or less. The second capacity curve is based on second sensing information indicating the voltage and the current of the battery B at each unit time, output by the sensing unit 110 for the second period. The control unit 120 may control the switch driver 200 to allow the discharge current of the second current rate to flow through the battery B for the second period. The second current rate may be equal to or different from the first current rate.

The control unit 120 may determine a voltage change dV and a remaining capacity change dQ of the battery B at each unit time from the first capacity curve. The control unit 120 may store, in the memory unit 130, a first data set indicating a correlation of the voltage V, the remaining capacity Q, the voltage change dV and the remaining capacity change dQ of the battery B at each unit time, determined from the first capacity curve.

The control unit 120 may determine a first differential capacity curve from the first data set. The first differential capacity curve indicates a relationship between the voltage V of the battery B for the first period and a ratio dQ/dV of the remaining capacity change dQ of the battery B to the voltage change dV of the battery B, and may be referred to as a first V-dQ/dV curve.

The control unit 120 may determine a voltage change dV and a remaining capacity change dQ of the battery B at each unit time from the second capacity curve. The control unit 120 may store, in the memory unit 130, a second data set indicating a correlation of the voltage V, the remaining capacity Q, the voltage change dV and the remaining capacity change dQ of the battery B at each unit time, determined from the second capacity curve.

The control unit 120 may determine a second differential capacity curve from the second data set. The second differential capacity curve indicates a relationship between the voltage V of the battery B for the second period and a ratio dQ/dV of the remaining capacity change dQ of the battery B to the voltage change dV of the battery B, and may be referred to as a second V-dQ/dV curve.

The memory unit 130 is operably coupled to the control unit 120. The memory unit 130 may be also operably coupled to the sensing unit 110. The memory unit 130 is configured to store the sensing information from the sensing unit 110. The memory unit 130 may store data and programs required for the calculation operation by the control unit 120. The memory unit 130 may store data indicating the results of the calculation operation by the control unit 120.

The memory unit 130 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

The switch driver 200 is electrically coupled to the apparatus 100 and the switch SW. The switch driver 200 is configured to selectively output the first switching signal or the second switching signal to the switch SW in response to the command from the apparatus 100.

The interface unit 140 is configured to support wired or wireless communication between the control unit 120 and a high-level controller 2 (e.g., an Electronic Control Unit (ECU)) of the electrical system 1. The wired communication may be, for example, controller area network (CAN) communication, and the wireless communication may be, for example, Zigbee or Bluetooth communication. The communication protocol is not limited to a particular type, and may include any type of communication protocol that supports the wired or wireless communication between the control unit 120 and the high-level controller 2. The interface unit 140 may include an output device such as a display or a speaker to provide the process results about the degradation degree of the battery B performed by the control unit 120 in a form that allows the user to recognize. The interface unit 140 may include an input device such as a mouse and a keyboard to receive an input of data from the user.

Figure 2:
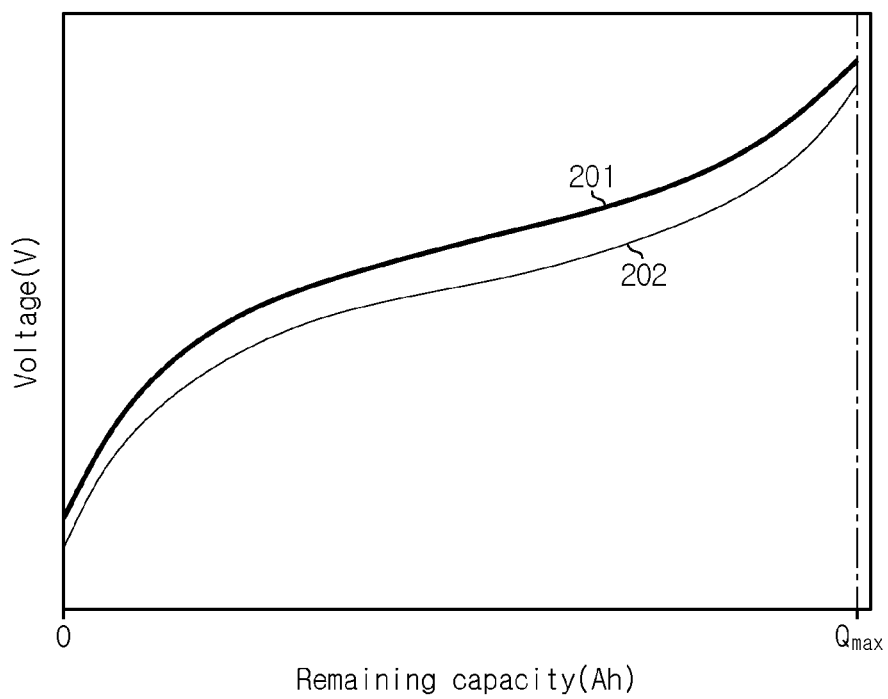
FIG. 2 is a graph illustrating a capacity curve of a battery when the battery is at the beginning of life.
Figure 3:
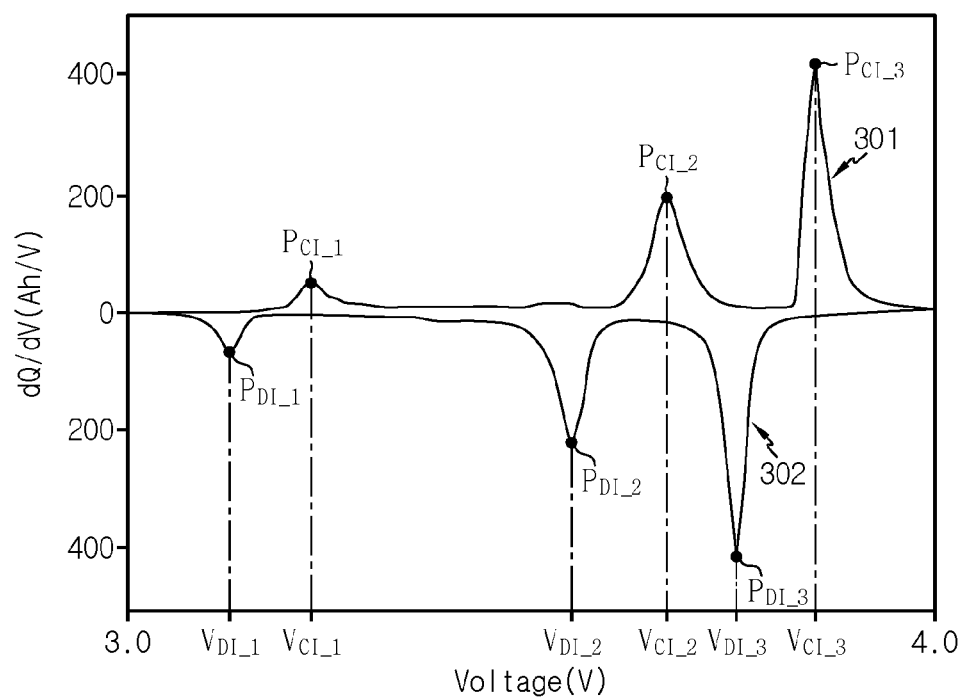
FIG. 3 is a graph illustrating a differential capacity curve determined from the capacity curve of FIG. 2.

FIG. 2 is a graph illustrating the capacity curve of the battery when the battery is at the beginning of life (BOL), and FIG. 3 is a graph illustrating the differential capacity curve determined from the capacity curve of FIG. 2.

The maximum capacity $Q_{max}$ of the battery B may be the remaining capacity of the battery B when the battery B is fully charged, that is, when the SOC of the battery B is 100%. The maximum capacity $Q_{max}$ of the battery B gradually decreases as the battery B degrades.

Referring to FIG. 2, the capacity curve 201 indicates a correlation between the voltage V and the remaining capacity Q of the battery B, acquired through the charge process of the battery B with a constant current of a predetermined current rate with the increasing SOC of the battery B at BOL from 0% to 100%.

The capacity curve 202 indicates a correlation between the voltage V and the remaining capacity Q of the battery B, acquired through the discharge process of the battery B with a constant current of a predetermined current rate with the decreasing SOC of the battery B at BOL from 100% to 0%.

Due to the hysteresis characteristics of the battery B, a difference between voltage of the capacity curve 201 and voltage of the capacity curve 202 at the same remaining capacity is equal to or larger than a predetermined threshold in at least part of the remaining capacity range between 0 and $Q_{max}$.

Referring to FIG. 3, the differential capacity curve 301 is determined from a relationship between the voltage history and the remaining capacity history indicated by the capacity curve 201. The differential capacity curve 302 is determined from a relationship between the voltage history and the remaining capacity history indicated by the capacity curve 202. For ease of understanding, the differential capacity curve 301 and the differential capacity curve 302 are shown above and below dQ/dV=0 Ah/V respectively.

The total number of peaks $P_{CI\_1}$, $P_{CI\_2}$, $P_{CI\_3}$ located on the differential capacity curve 301 and the number of peaks $P_{DI\_1}$, $P_{DI\_2}$, $P_{DI\_3}$ located on the differential capacity curve 302 may be equal. The total number of peaks located on each of the differential capacity curve 301 and the differential capacity curve 302 relies on the electrode material, etc. of the battery B. Accordingly, the total number of peaks located on each of the differential capacity curve 301 and the differential capacity curve 302 may be constant, even though the battery B degrades. Hereinafter, assume that the total number of peaks $P_{CI\_1}$, $P_{CI\_2}$, $P_{CI\_3}$ appearing in the differential capacity curve 301 and the total number of peaks $P_{DI\_1}$, $P_{DI\_2}$, $P_{DI\_3}$ located on the differential capacity curve 302 is 3 respectively.

The memory unit 130 may store charge feature values (referred to as 'initial charge feature values') indicating voltage values $V_{CI\_1}$, $V_{CI\_2}$, $V_{CI\_3}$ of the peaks $P_{CI\_1}$, $P_{CI\_2}$, $P_{CI\_3}$ located on the differential capacity curve 301, respectively.

The memory unit 130 may store discharge feature values (referred to as 'initial discharge feature values') indicating voltage values $V_{DI\_1}$, $V_{DI\_2}$, $V_{DI\_3}$ of the peaks $P_{DI\_1}$, $P_{DI\_2}$, $P_{DI\_3}$ located on the differential capacity curve 302, respectively.

The inventor recognized the fact that the hysteresis characteristics of the battery B become severer as the battery B degrades from the charge and discharge test results of a battery of the same specifications as the battery B.

Figure 4:
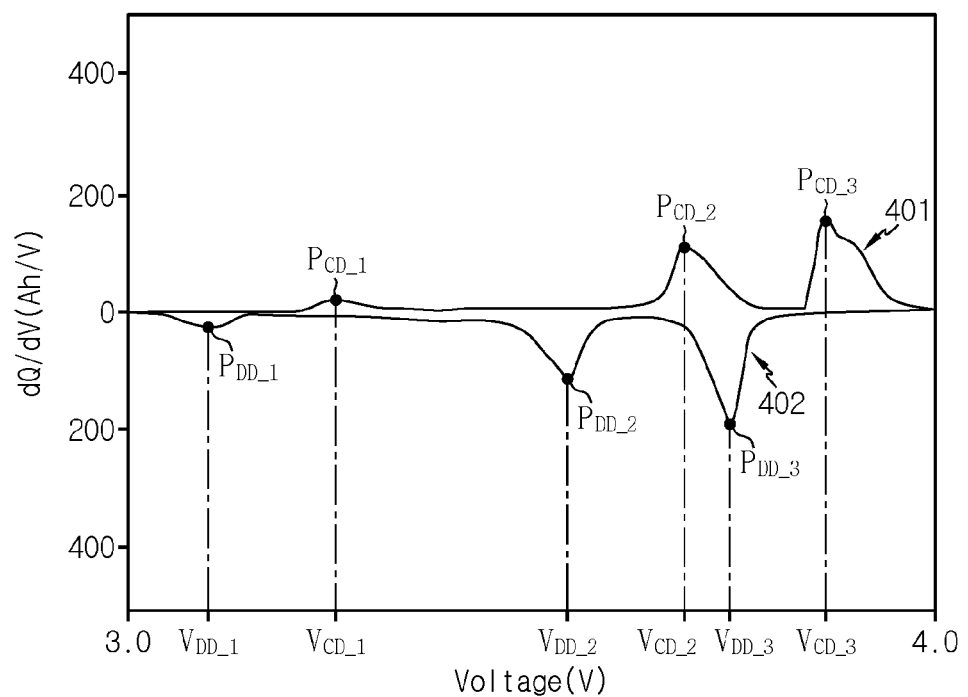
FIG. 4 is a graph illustrating a differential capacity curve of a battery when the battery at the beginning of life degrades.

FIG. 4 is a graph illustrating the differential capacity curve of the battery when the battery at BOL degrades.

Referring to FIG. 4, the differential capacity curve 401 is determined from a relationship between the voltage history and the remaining capacity history for the first period. The differential capacity curve 402 is determined from a relationship between the voltage history and the remaining capacity history for the second period. For ease of understanding, the differential capacity curve 401 and the differential capacity curve 402 are shown above and below dQ/dV=0.

The differential capacity curve 401 has the same number of peaks $P_{CD\_1}$, $P_{CD\_2}$, $P_{CD\_3}$ as the peaks $P_{CI\_1}$, $P_{CI\_2}$, $P_{CI\_3}$ appearing in the differential capacity curve 301. The differential capacity curve 402 has the same number of peaks $P_{DD\_1}$, $P_{DD\_2}$, $P_{DD\_3}$ as the peaks $P_{DI\_1}$, $P_{DI\_2}$, $P_{DI\_3}$ appearing in the differential capacity curve 302.

In the differential capacity curve 401, the peak $P_{CD\_1}$, the peak $P_{CD\_2}$ and the peak $P_{CD\_3}$ are located in ascending order of the remaining capacity. The peaks $P_{CD\_1}$, $P_{CD\_2}$, $P_{CD\_3}$ appearing in the differential capacity curve 401 correspond to the peaks $P_{CI\_1}$, $P_{CI\_2}$, $P_{CI\_3}$ appearing in the differential capacity curve 301 respectively. The peaks $P_{CD\_1}$, $P_{CD\_2}$, $P_{CD\_3}$ may be referred to as 'charge feature points', and the voltage values of $V_{CD\_1}$, $V_{CD\_2}$, $V_{CD\_3}$ of the peaks $P_{CD\_1}$, $P_{CD\_2}$, $P_{CD\_3}$ may be referred to as 'charge feature values'.

In the differential capacity curve 402, the peak $P_{DD\_1}$, the peak $P_{DD\_2}$ and the peak $P_{DD\_3}$ are located in ascending order of the remaining capacity. The peaks $P_{DD\_1}$, $P_{DD\_2}$, $P_{DD\_3}$ appearing in the differential capacity curve 402 correspond to the peaks $P_{DI\_1}$, $P_{DI\_2}$, $P_{DI\_3}$ appearing in the differential capacity curve 302 respectively. The peaks $P_{DD\_1}$, $P_{DD\_2}$, $P_{DD\_3}$ may be referred to as 'discharge feature points', and the voltage values $V_{DD\_1}$, $V_{DD\_2}$, $V_{DD\_3}$ of the peaks $P_{DD\_1}$, $P_{DD\_2}$, $P_{DD\_3}$ may be referred to as 'discharge feature values'.

Referring to FIGS. 2 to 4, it can be seen that as the battery B degrades, (I) the charge feature values of $V_{CD\_1}$, $V_{CD\_2}$, $V_{CD\_3}$ of the peaks $P_{CD\_1}$, $P_{CD\_2}$, $P_{CD\_3}$ located on the differential capacity curve 401 increase from the initial charge feature values $V_{CI\_1}$, $V_{CI\_2}$, $V_{CI\_3}$ of the peaks $P_{CI\_1}$, $P_{CI\_2}$, $P_{CI\_3}$ located in the same order on the differential capacity curve 301, and (II) the discharge feature values of $V_{DD\_1}$, $V_{DD\_2}$, $V_{DD\_3}$ of the peaks $P_{DD\_1}$, $P_{DD\_2}$, $P_{DD\_3}$ located on the differential capacity curve 402 decreases from the initial discharge feature values $V_{DI\_1}$, $V_{DI\_2}$, $V_{DI\_3}$ of the peaks $P_{DI\_1}$, $P_{DI\_2}$, $P_{DI\_3}$ located in the same order on the differential capacity curve 302. That is, as the battery B degrades, the peaks $P_{CD\_1}$, $P_{CD\_2}$, $P_{CD\_3}$ of the differential capacity curve 401 are shifted to higher voltage, and the peaks $P_{DD\_1}$, $P_{DD\_2}$, $P_{DD\_3}$ of the differential capacity curve 402 are shifted to lower voltage.

The inventor found that a difference between the voltage values (e.g., $V_{CD\_1}$, $V_{DD\_1}$) of the two peaks (e.g., $P_{CD\_1}$, $P_{DD\_1}$) appearing in the same order (e.g., the first order) on the differential capacity curve 401 and the differential capacity curve 402 has a strong correlation with the degradation degree of the battery B.

Figure 5:
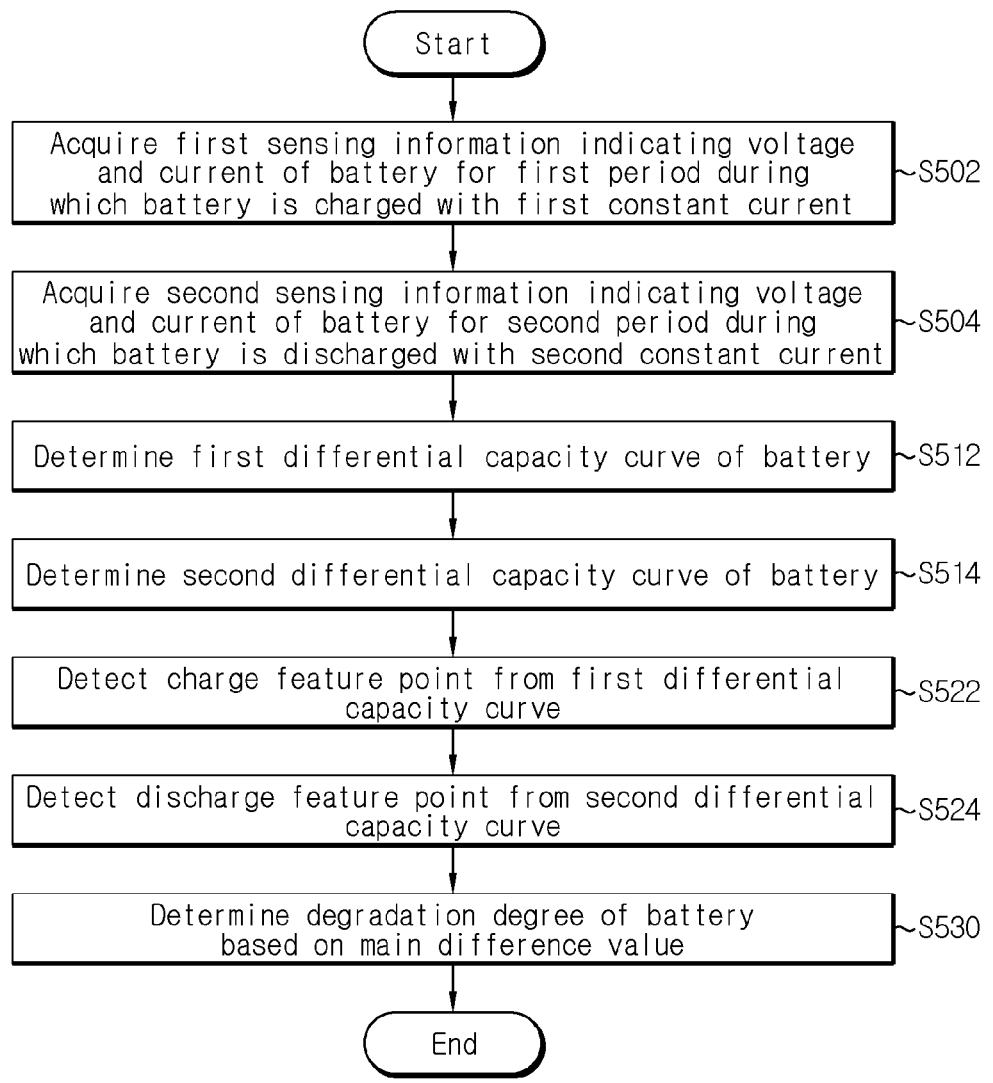
FIG. 5 is a flowchart illustrating a method for determining a degradation degree of a battery according to a first embodiment of the present disclosure.

FIG. 5 is a flowchart illustrating a method for determining the degradation degree of the battery according to an embodiment of the present disclosure. The method of FIG. 5 may be used to determine the degradation degree of the battery where there is at least one peak on the differential capacity curve B.

Referring to FIGS. 1 to 5, in step S502, the control unit 120 acquires, from the sensing unit 110, first sensing information indicating the voltage and the current of the battery B for the first period during which the battery B is charged with the first constant current.

In step S504, the control unit 120 acquires, from the sensing unit 110, second sensing information indicating the voltage and the current of the battery B for the second period during which the battery B is discharged with the second constant current.

In step S512, the control unit 120 determines a first differential capacity curve of the battery B based on the first sensing information. For example, the first differential capacity curve may be the differential capacity curve 401 of FIG. 4.

In step S514, the control unit 120 determines a second differential capacity curve of the battery B based on the second sensing information. For example, the second differential capacity curve may be the differential capacity curve 402 of FIG. 4.

In step S522, the control unit 120 detects a charge feature point (e.g., $P_{CD\_2}$) from the first differential capacity curve. The charge feature point (e.g., $P_{CD\_2}$) may be a peak located in a predetermined order (e.g., the second order) on the basis of the remaining capacity among all peaks of the first differential capacity curve.

In step S524, the control unit 120 detects a discharge feature point (e.g., $P_{DD\_2}$) from the second differential capacity curve. The discharge feature point (e.g., $P_{DD\_2}$) may be a peak located in the predetermined order (e.g., the second order) on the basis of the remaining capacity among all peaks of the second differential capacity curve.

In step S530, the control unit 120 determines the degradation degree of the battery B based on a main difference value. The main difference value is an absolute value (e.g., $|V_{CD\_2} - V_{DD\_2}|$) of a difference between a charge feature value (e.g., $V_{CD\_2}$) and a discharge feature value (e.g., $V_{DD\_2}$). The charge feature value (e.g., $V_{CD\_2}$) is a voltage value of the charge feature point (e.g., $P_{CD\_2}$), and the discharge feature value (e.g., $V_{DD\_2}$) is a voltage value of the discharge feature point (e.g., $P_{DD\_2}$). The control unit 120 determines the degradation degree of the battery B from a first data table that records a correlation between the main difference value determined in the step S530 and the degradation degree, using the main difference value as an index.

The first data table may be stored in the memory unit 130. As the hysteresis characteristics of the battery B become stronger, the main difference value tends to increase. Accordingly, a larger main difference value may be associated with a higher degradation degree in the first data table.

Figure 6:
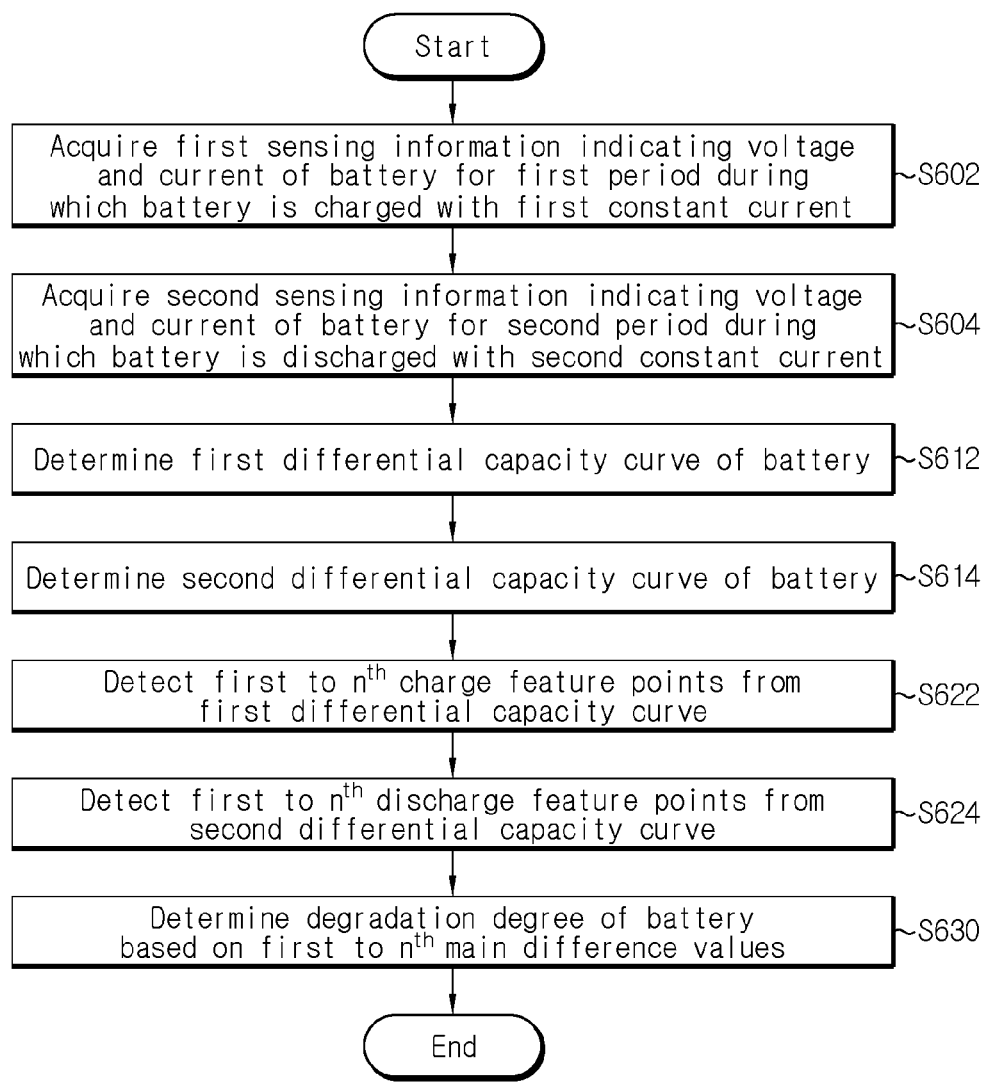
FIG. 6 is a flowchart illustrating a method for determining a degradation degree of a battery according to a second embodiment of the present disclosure.

FIG. 6 is a flowchart illustrating a method for determining the degradation degree of the battery according to a second embodiment of the present disclosure. The method of FIG. 6 may be used to determine the degradation degree of the battery B where there are at least two peaks on the differential capacity curve.

Referring to FIGS. 1 to 4 and 6, in step S602, the control unit 120 acquires, from the sensing unit 110, first sensing information indicating the voltage and the current of the battery B for the first period during which the battery B is charged with the first constant current.

In step S604, the control unit 120 acquires, from the sensing unit 110, second sensing information indicating the voltage and current of the battery B for the second period during which the battery B is discharged with the second constant current.

In step S612, the control unit 120 determines a first differential capacity curve of the battery B based on the first sensing information. For example, the first differential capacity curve may be the differential capacity curve 401 of FIG. 4.

In step S614, the control unit 120 determines a second differential capacity curve of the battery B based on the second sensing information. For example, the second differential capacity curve may be the differential capacity curve 402 of FIG. 4.

In step S622, the control unit 120 detects first to $n^{th}$ charge feature points from the first differential capacity curve. n is a natural number of 2 or greater, and is a predetermined value indicating the number that is equal to or less than the total number of peaks located on the first differential capacity curve. When i=1 to n, the $i^{th}$ charge feature point may be a peak located in the $i^{th}$ order among the first to $n^{th}$ charge feature points on the basis of the remaining capacity.

In step S624, the control unit 120 detects first to $n^{th}$ discharge feature points from the second differential capacity curve. The $i^{th}$ discharge feature point may be a peak located in the $i^{th}$ order among the first to $n^{th}$ discharge feature points on the basis of the remaining capacity.

In step S630, the control unit 120 determines the degradation degree of the battery B based on first to $n^{th}$ main difference values. When i=1 to n, the $i^{th}$ main difference value may be an absolute value of a difference between an $i^{th}$ charge feature value and an $i^{th}$ discharge feature value. The $i^{th}$ charge feature value is a voltage value of the $i^{th}$ charge feature point, and the $i^{th}$ discharge feature value is a voltage value of the $i^{th}$ discharge feature point. Subsequently, the control unit 120 determines a first degradation factor from the first to $n^{th}$ main difference values. The control unit 120 may determine the first degradation factor using the following Equation 1.

$$F_{deg} = \sum_{i=1}^{n}(\Delta V_i \times \alpha_i) = \sum_{i=1}^{n}(|V_{CD\_i} - V_{DD\_i}| \times \alpha_i) \qquad \text{[Equation 1]}$$

In Equation 1, $\Delta V_i$ is the $i^{th}$ main difference value, $V_{CD\_i}$ is the $i^{th}$ charge feature value, $V_{DD\_i}$ is the $i^{th}$ discharge feature value, $\alpha_i$ is an $i^{th}$ predetermined weight, and $F_{deg}$ is the first degradation factor. $\alpha_i$ may be a preset value based on an increase of the $i^{th}$ charge feature value and a decrease of the $i^{th}$ discharge feature value as the battery B degrades. The increase of the $i^{th}$ charge feature value may be a ratio of the $i^{th}$ charge feature value to the $i^{th}$ initial charge feature value. The decrease of the $i^{th}$ discharge feature value may be a ratio of the $i^{th}$ discharge feature value to the $i^{th}$ initial discharge feature value.

For example, when n is 2, the above Equation 1 may be represented as the following Equation 2.

$$F_{deg} = \sum_{i=1}^{2}(\Delta V_i \times \alpha_i) \qquad \text{[Equation 2]}$$

The control unit 120 determines the degradation degree of the battery B from a second data table that records a correlation between the first degradation factor $F_{deg}$ determined in the step S630 and the degradation degree, using the first degradation factor as an index.

The second data table may be stored in the memory unit 130. As the hysteresis characteristics of the battery B become stronger, each of the first to $n^{th}$ main difference values tends to increase. Accordingly, a larger first degradation factor may be associated with a higher degradation degree in the second data table.

FIG. 7 is a flowchart illustrating a method for determining the degradation of the battery according to a third embodiment of the present disclosure. The method of FIG. 7 may be used to determine the degradation degree of the battery B where there is at least one peak on the differential capacity curve.

Referring to FIGS. 1 to 4 and 7, in step S702, the control unit 120 acquires, from the sensing unit 110, first sensing information indicating the voltage and the current of the battery B for the first period during which the battery B is charged with the first constant current.

In step S704, the control unit 120 acquires, from the sensing unit 110, second sensing information indicating the voltage and current of the battery B for the second period during which the battery B is discharged with the second constant current.

In step S712, the control unit 120 determines a first differential capacity curve of the battery B based on the first sensing information. For example, the first differential capacity curve may be the differential capacity curve 401 of FIG. 4.

In step S714, the control unit 120 determines a second differential capacity curve of the battery B based on the second sensing information. For example, the second differential capacity curve may be the differential capacity curve 402 of FIG. 4.

In step S722, the control unit 120 detects a charge feature point (e.g., $P_{CD\_2}$) from the first differential capacity curve. The charge feature point (e.g., $P_{CD\_2}$) may be a peak located in a predetermined order on the basis of the remaining capacity among all peaks of the first differential capacity curve.

In step S724, the control unit 120 detects a discharge feature point (e.g., $P_{DD\_2}$) from the second differential capacity curve. The discharge feature point (e.g., $P_{DD\_2}$) may be a peak located in the predetermined order on the basis of the remaining capacity among all peaks of the second differential capacity curve.

In step S730, the control unit 120 determines the degradation degree of the battery B based on a first sub-difference value (e.g., $|V_{CD\_2} - V_{CI\_2}|$) that is an absolute value of a difference between a charge feature value (e.g., $V_{CD\_2}$) and an initial charge feature value (e.g., $V_{CI\_2}$) and a second sub-difference value (e.g., $|V_{DD\_2} - V_{DI\_2}|$) that is an absolute value of a difference between a discharge feature value (e.g., $V_{DD\_2}$) and an initial discharge feature value (e.g., $V_{DI\_2}$).

The initial charge feature value (e.g., $V_{CI\_2}$) may be a voltage value of the peak (e.g., $P_{CI\_2}$) located in the predetermined order on the differential capacity curve 301. The initial discharge feature value (e.g., $V_{DI\_2}$) may be a voltage value of the peak (e.g., $P_{DI\_2}$) located in the predetermined order on the differential capacity curve 302.

The charge feature value (e.g., $V_{CD\_2}$) is a voltage value of the charge feature point (e.g., $V_{CD\_2}$), and the discharge feature value (e.g., $V_{DD\_2}$) is a voltage value of the discharge feature point (e.g., $V_{DD\_2}$). The control unit 120 may determine the sum of the product of the first sub-difference value and a first transform coefficient and the product of the second sub-difference value and a second transform coefficient as a second degradation factor. The first transform coefficient and the second transform coefficient may be values for adjusting a relative size between the first sub-difference value and the second sub-difference value since the first sub-difference value and the second sub-difference value may be different from each other when the degradation degree of the battery B is the same. The first transform coefficient may be a preset positive number based on a correlation between the degradation degree of the battery B and the first sub-difference value. The second transform coefficient may be a preset positive number based on a correlation between the degradation degree of the battery B and the second sub-difference value.

The control unit 120 determines the degradation degree of the battery B from a third data table that records a correlation between the second degradation factor determined in the step S730 and the degradation degree using the second degradation factor as an index.

The third data table may be stored in the memory unit 130. As the hysteresis characteristics of the battery B become stronger, the first sub-difference value and the second sub-difference value tend to increase at different rates. Accordingly, a larger second degradation factor is associated with a higher degradation degree in the third data table.

When a ratio of one of the first sub-difference value (e.g., $|V_{CD\_2} - V_{CI\_2}|$) and the second sub-difference value (e.g., $|V_{DD\_2} - V_{DI\_2}|$) to the other exceeds a predetermined range, the control unit 120 may determine that the battery B is abnormal. In this case, the control unit 120 may output a message for notifying that the battery B is abnormal to the user using the interface unit 140, instead of determining the degradation degree of the battery B.

When the degradation degree of the battery B is determined according to at least one of the first to third embodiments, the control unit 120 may output a message for notifying the degradation degree of the battery to the user using the interface unit 140.

The embodiments of the present disclosure described hereinabove are not implemented only through the apparatus and method, and may be implemented through programs that realize the functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure by those skilled in the art without departing from the technical aspects of the present disclosure, the present disclosure is not limited by the foregoing embodiments and the accompanying drawings, and some or all of the embodiments may be selectively combined to make various modifications to the present disclosure.

What is claimed is:

1. An apparatus for determining a degree of degradation of a battery, the apparatus comprising:
    a sensing unit configured to generate first sensing information indicating a voltage and a current of the battery for a first period during which the battery is charged with a first constant current and second sensing information indicating a voltage and a current of the battery for a second period during which the battery is discharged with a second constant current; and
    a control unit operably coupled to the sensing unit, wherein the control unit is configured to:
        determine a first differential capacity curve of the battery based on the first sensing information;
        detect a first charge feature point from the first differential capacity curve, wherein the first charge feature point is an $i^{th}$ peak of one or more ordered first peaks;
        determine a second differential capacity curve of the battery based on the second sensing information;
        detect a first discharge feature point from the second differential capacity curve, wherein the first discharge feature point is the $i^{th}$ peak of one or more ordered second peaks; and
        determine the degree of degradation of the battery based on a first main difference value indicating an absolute value of a difference between a first charge feature value and a first discharge feature value, wherein the first charge feature value is a voltage value of the first charge feature point, and the first discharge feature value is a voltage value of the first discharge feature point.

2. The apparatus according to claim 1, wherein the first differential capacity curve includes the one or more ordered first peaks, wherein the second differential capacity curve includes the one or more ordered second peaks, wherein a total number of the ordered first peaks is predetermined, wherein a total number of the ordered second peaks is predetermined.

3. The apparatus according to claim 2, wherein the total number of the ordered first peaks is two or greater, wherein the total number of the ordered second peaks is two or greater, and wherein the control unit is configured to:
    determine a second charge feature point from the first differential capacity curve, wherein the second charge feature point is an $j^{th}$ peak of the ordered first peaks;
    determine a second discharge feature point from the second differential capacity curve, wherein the second discharge feature point is an $j^{th}$ peak of the ordered second peaks, wherein j is a predetermined value; and
    determine a second main difference value indicating an absolute value of a difference between a second charge feature value and a second discharge feature value, wherein the second charge feature value is a voltage value of the second charge feature point, and the second discharge feature value is a voltage value of the second discharge feature point.

4. The apparatus according to claim 3, wherein the control unit is configured to,
    determine a first degradation factor using the following Equation:

$$F_{deg} = \sum_{i=1}^{2}(\Delta V_i \times \alpha_i)$$

wherein $\Delta V_i$ is an $i^{th}$ main difference value, $\alpha_i$ is an $j^{th}$ predetermined weight, and $F_{deg}$ is the first degradation factor; and
    determine the degree of degradation of the battery from a second data table that includes a correlation between the first degradation factor and the degree of degradation, using the first degradation factor as an index.

5. The apparatus according to claim 1, wherein the control unit is configured to determine the degree of degradation of the battery from a first data table that includes a correlation between the first main difference value and the degree of degradation, using the first main difference value as an index.

6. A battery pack comprising the apparatus according to claim 1.

7. An apparatus for determining a degree of degradation of a battery, the apparatus comprising:
    a sensing unit configured to generate first sensing information indicating a voltage and a current of the battery for a first period during which the battery is charged with a first constant current and second sensing information indicating a voltage and a current of the battery for a second period during which the battery is discharged with a second constant current; and
    a control unit operably coupled to the sensing unit, wherein the control unit is configured to:
        determine a first differential capacity curve of the battery based on the first sensing information;
        detect a first charge feature point from the first differential capacity curve;
        determine a second differential capacity curve of the battery based on the second sensing information;
        detect a first discharge feature point from the second differential capacity curve; and
        determine the degree of degradation of the battery based on a first charge feature value and a first discharge feature value, wherein the first charge feature value is a voltage value of the first charge feature point, and the first discharge feature value is a voltage value of the first discharge feature point, wherein the control unit is configured to:

determine a first sub-difference value indicating an absolute value of a difference between the first charge feature value and a first initial charge feature value;

determine a second sub-difference value indicating an absolute value of a difference between the first discharge feature value and a first initial discharge feature value; and determine the degree of degradation of the battery based on the first sub-difference value and the second sub-difference value.

8. The apparatus according to claim 7, wherein the control unit is configured to:

determine a second degradation factor, wherein the second degradation factor is a sum of (i) a product of the first sub-difference value and a first transform coefficient and (ii) a product of the second sub-difference value and a second transform coefficient; and determine the degree of degradation of the battery from a third data table that includes a correlation between the second degradation factor and the degree of degradation, using the second degradation factor as an index.

9. A method comprising:

acquiring first sensing information indicating a voltage and a current of the battery for a first period during which the battery is charged with a first constant current;

acquiring second sensing information indicating a voltage and a current of the battery for a second period during which the battery is discharged with a second constant current;

determining a first differential capacity curve of the battery based on the first sensing information;

determining a second differential capacity curve of the battery based on the second sensing information;

detecting a first charge feature point from the first differential capacity curve, wherein the first charge feature point is an $i^{th}$ peak of one or more ordered first peaks;

detecting a first discharge feature point from the second differential capacity curve wherein the first discharge feature point is the $i^{th}$ peak of one or more ordered second peaks; and determining the degree of degradation of the battery based on a first main difference value indicating an absolute value of a difference between a first charge feature value and a first discharge feature value wherein the first charge feature value is a voltage value of the first charge feature point, and the first discharge feature value is a voltage value of the first discharge feature point.

10. The method according to claim 9, wherein determining the degree of degradation of the battery is further based from a first data table that records a correlation between the first main difference value and the degree of degradation, using the first main difference value as an index.

11. A method comprising:

acquiring first sensing information indicating a voltage and a current of the battery for a first period during which the battery is charged with a first constant current;

acquiring second sensing information indicating a voltage and a current of the battery for a second period during which the battery is discharged with a second constant current;

determining a first differential capacity curve of the battery based on the first sensing information;

determining a second differential capacity curve of the battery based on the second sensing information;

detecting a first charge feature point from the first differential capacity curve;

detecting a first discharge feature point from the second differential capacity curve; and determining a first sub-difference value indicating an absolute value of a difference between the first charge feature value and a first initial charge feature value;

determining a second sub-difference value indicating an absolute value of a difference between the first discharge feature value and a first initial discharge feature value; and determining the degree of degradation of the battery based on the first sub-difference value and the second sub-difference value.

* * * * *